(12) United States Patent
Lo

(10) Patent No.: US 6,362,616 B1
(45) Date of Patent: Mar. 26, 2002

(54) FLAT RESPONSE TEMPERATURE GAUGE WITH A SINGLE DIODE

(75) Inventor: Alan J. Lo, Troy, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/663,804

(22) Filed: Sep. 15, 2000

(51) Int. Cl.[7] .............................. G01R 5/16; G01R 1/20; G01R 15/08
(52) U.S. Cl. ....................... 324/146; 324/119; 324/132
(58) Field of Search .................................. 324/144, 146, 324/147, 115, 119, 132, 154 R; 335/222; 336/55; 116/289; 340/449

(56) References Cited

U.S. PATENT DOCUMENTS

| | | | |
|---|---|---|---|
| 4,335,351 A | * 6/1982 | Faria ........................... | 324/146 |
| 4,715,043 A | * 12/1987 | Chikasue ................. | 324/144 X |
| 4,758,784 A | 7/1988 | Baker et al. ................. | 324/146 |
| 4,953,797 A | 9/1990 | Markow et al. ........... | 242/7.11 |
| 4,992,726 A | 2/1991 | Markow et al. ............ | 324/146 |
| 5,004,976 A | 4/1991 | Markow et al. ........ | 324/154 R |
| 5,038,099 A | 8/1991 | Markow et al. ........ | 324/140 D |
| 5,414,350 A | 5/1995 | Chellman .................... | 324/143 |
| 5,686,832 A | 11/1997 | Ayres et al. ................ | 324/146 |

FOREIGN PATENT DOCUMENTS

JP                28643 A   *  1/2000

* cited by examiner

Primary Examiner—Gerard R. Strecker
(74) Attorney, Agent, or Firm—Quarles & Brady LLP

(57) ABSTRACT

An analog gauge includes a coil assembly and a permanent magnet fixedly attached to a rotatable shaft whereby magnetically orthogonal stator coils are disposed about the permanent magnet. The shaft is fixedly attached to a pointer arm that moves over a dial face. As electrical current passes through the coils, electromagnetic fields are induced which, when summed, comprise a magnetic force which is followed by the permanent magnet, shaft, and pointer arm. With reduced-parts circuitry, the flat zone responsiveness of the circuit is delayed until a zener diode is forward biased, yielding increased control over the flat zone responsiveness, without reliance upon the voltage drop across a diode connected between ground and the coil located furthest from the power source.

19 Claims, 3 Drawing Sheets

FLAT RESPONSE TEMPERATURE GAUGE WITH A SINGLE DIODE

CROSS-REFERENCES TO RELATED APPLICATIONS

STATEMENT REGARDING FEDERALLY SPONSORED RESEARCH OR DEVELOPMENT

BACKGROUND OF THE INVENTION

1. Field of the Invention

This invention relates to analog gauges and specifically to flat response temperature circuitry for analog gauges yielding a decreased parts count and increased control over a "flat zone" of the gauge.

2. Description of Related Art

Analog gauges are commonly used to display automobile data to a driver. In a typical analog gauge, electrical current flows through wire coils disposed about a permanent magnet. The amount of electrical current flowing through each coil varies according to the value of a measurand at a remote location.

As current flows through each coil, a magnetic field B is induced proximal to the coil. The direction of the magnetic field is determined by the direction of the winding of the coil as given by the right-hand-rule. In general, a stronger magnetic field can be created by allowing more current to pass through a given coil. The strength and direction of the magnetic field can be represented by a vector having a magnitude corresponding to the strength of the magnetic field and a direction corresponding to the direction of the induced magnetic field.

The magnetic fields induced about each coil combine to create a resultant magnetic force which is, in terms of direction, followed by the permanent magnet about which the coils are disposed. The permanent magnet is attached to a rotatable shaft that is attached to a pointer arm that moves over a dial face in response to changes in the direction of the resultant force. Circuitry, attached to the coils, varies the relative current flow in each coil to change the resultant magnetic vector corresponding to the value of the measurand at the remote location. If the measurand changes, the direction of the resultant force will change and the shaft and pointer will rotate accordingly.

In a linear gauge, the shaft responds in a linear relationship to changes in the measurand at the remote location. For example, in a linear temperature gauge, a 20% change in temperature causes a 20% rotation in the magnet, shaft, and pointer. Alternatively, the responsiveness of the gauge can be reduced for a predetermined range of temperatures. Such a gauge is commonly referred to as a "flat response" gauge because a "flat zone" is created in which the circuitry of the gauge has a reduced level of responsiveness to changes in the measurand.

The prior art circuit of FIG. 1A is exemplary and provides for a power source 10 such as a DC battery and a bridge resistor 12 having one terminal connected to the power source 10 and one terminal connected to a sender resistor 14 such as a thermistor. The sender resistor 14 has its remaining terminal connected to ground. This sender resistor 14 has an operating resistance of 275–18.3 $\Omega$.

Further connected to the power source 10 is a first coil $L_1$ having one terminal connected to the power source 10 and one terminal connected to a second coil $L_2$. $L_2$ is in series with $L_1$ and has its remaining terminal connected to a third coil $L_3$. $L_3$ has one terminal connected to $L_2$ and one terminal connected to a fourth coil $L_4$. $L_4$ has its remaining terminal connected to an anode of first diode 16 whose cathode 16C is connected to ground.

$L_3$, $L_4$, and the first diode 16 are connected in series, and $L_1$ is wound about a first axis, $L_2$ and $L_3$ are counterwound about the same first axis, and $L_4$ is counterwound about a second axis which is magnetically orthogonal to the first axis. $L_1$ and $L_2$ are formed from a single piece of uninterrupted wire having a resistance of 235.2 $\Omega$, and $L_3$ and $L_4$ are formed from a single piece of uninterrupted wire having a resistance of 100.6 $\Omega$. $L_1$ comprises 1290 turns of wire; $L_2$, 490 turns; $L_3$, 630 turns; and $L_4$, 310 turns.

The prior art circuit further includes a zener diode 18 connected at its anode 18A to the common terminal between $L_2$ and $L_3$ and at its cathode 18C to the common terminal between the bridge resistor 12 and the sender resistor 14. The zener diode 18 is a 3.6 V, 1 W zener diode, and, dependent on the resistance of the sender resistor 14, it provides a current path when reverse biased or forward biased, as will be elaborated upon below. The zener diode 18, in conjunction with the resistance of the sender resistor 14, establishes the flat zone responsiveness of the circuit.

Referring now to FIG. 1B, the magnetic fields induced by the electrical currents flowing through each coil $L_1$–$L_4$ are depicted by individual vectors $B_1$–$B_4$, respectively, each vector having a magnitude corresponding to the strength of the related magnetic field and a direction corresponding to the direction of the related magnetic field according to the right hand rule oriented along the appropriate winding axis. Because coils $L_1$, $L_2$, and $L_3$ are wound about the same magnetic axis, their respective magnetic fields, $B_1$, $B_2$, and $B_3$, lie along a common axis. Stronger magnetic fields are represented by vectors having greater magnitudes along the appropriate axes, and the direction of the magnetic fields induced by coils $L_2$ and $L_3$ (i.e., $B_2$ and $B_3$, respectively) are aligned with one another because both are wound about the same axis in the same direction, as opposed to the magnetic field induced by coil $L_1$ (i.e., $B_1$), which is counterwound about the same magnetic axis in the opposite direction. The magnetic field induced by coil $L_1$ therefore magnetically opposes the fields induced by coils $L_2$ and $L_3$. The magnetic field induced by coil $L_4$ (i.e., $B_4$) is magnetically orthogonal to the magnetic field induced by coils $L_1$–$L_3$ because $L_4$ is wound about a second axis which is magnetically orthogonal to the first. What is needed, however, is circuitry having magnetic fields induced in all four directions from the common origin located at the intersection of the winding axes of the coils $L_1$–$L_4$.

Finally, a resultant magnetic force acting on the permanent magnet can be represented by a resultant vector B having a magnitude and direction which is equal to the sum of the individual magnitudes and directions of the magnetic fields $B_1$–$B_4$ induced by the coils $L_1$–$L_4$, respectively. The direction of the resultant vector corresponds to the direction of the resultant force and determines the amount of rotation of the permanent magnet, shaft, and pointer, which are fixedly attached to one another.

Unfortunately, however, traditional flat response circuitry has significant drawbacks. For example, a diode must be connected in series between ground and $L_4$. That is, the coil that is furthest from the power source, in order to provide a voltage drop to allow adjusting the flat zone responsiveness of the circuit. Moreover, different manufacturers require different flat response curves for arbitrary sender resistances, and the circuitry of the prior art does not allow the flexibility required to implement different flat response curves.

What is needed, therefore, is circuitry allowing increased control over the flat zone responsiveness of a non-linear gauge. Such circuitry must be flexible enough to meet the demands of numerous manufacturers utilizing different sender resistors and demanding differing levels of angular displacements of the pointer arm over the dial face.

BRIEF SUMMARY OF THE INVENTION

Briefly, the circuitry of the present invention comprises a plurality of coils wound about a first axis and a plurality of coils wound about a second axis, the second axis being magnetically orthogonal to the first axis. A single zener diode is provided having its cathode connected to a common terminal between a bridge resistor and a sender resistor and its anode connected to a common terminal between the coils wound about the second axis. In an embodiment described below, the sender resistor is a thermistor and the zener diode conducts in a forward or reverse direction dependent upon the resistance of the sender resistor compared to the bridge resistor. This circuitry provides a flat zone responsiveness without a second diode. By eliminating the need for this second diode, cost and circuit space are saved and the reliability of the gauge is increased. The circuitry is simplified because the number of turns of each coil and hence the relative strength of the four magnetic fields can be readily adapted to operate with diverse senders. Thus, it is no longer necessary to individually adjust and calibrate the sender resistance based upon specified levels of flat zone responsiveness.

Accordingly, it is an object of the present invention to provide non-linear gauge circuitry having increased flexibility with respect to setting the flat zone responsiveness of the circuit. It is a further object of this invention to achieve this increased flexibility with a minimum number of circuit elements. It is another object of this invention to provide circuitry having magnetic fields induced in four directions from an origin located at the intersection of the winding axes of the coils. It is still another object to provide circuitry yielding increased control over the resultant force comprised of the summation of the individual magnetic fields induced about the individual coils of the circuit.

The foregoing and other objects, advantages, and aspects of the present invention will become apparent from the following description. In the description, reference is made to the accompanying drawings which form a part hereof, and in which there is shown, by way of illustration, a preferred embodiment of the present invention. Such embodiment does not necessarily represent the full scope of the invention, however, and reference must also be made to the claims herein for properly interpreting the scope of this invention.

DETAILED DESCRIPTION OF THE INVENTION

Figure 1A:
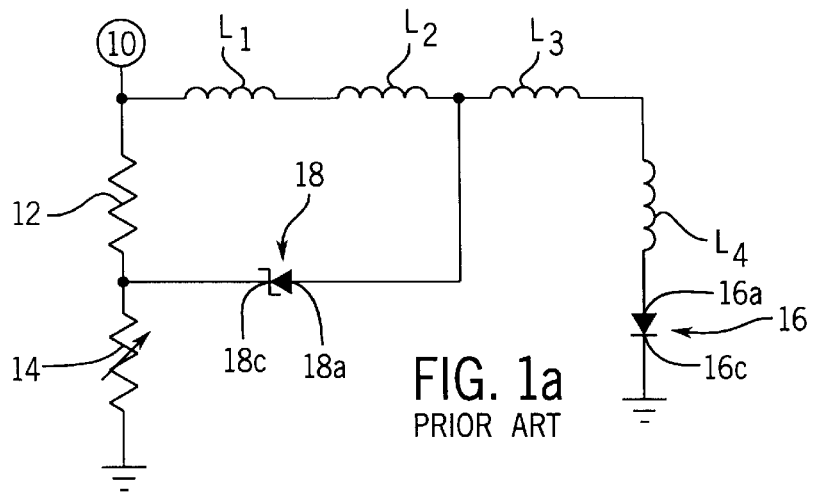
FIG. 1A is a schematic diagram of a prior art flat response circuit.
Figure 1B:
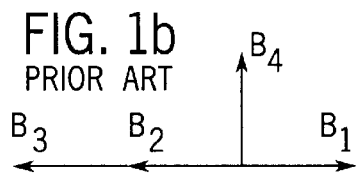
FIG. 1B is a vector diagram illustrating vectors corresponding to the magnetic fields induced by passing current through the coils of the circuit of FIG. 1A.
Figure 2:
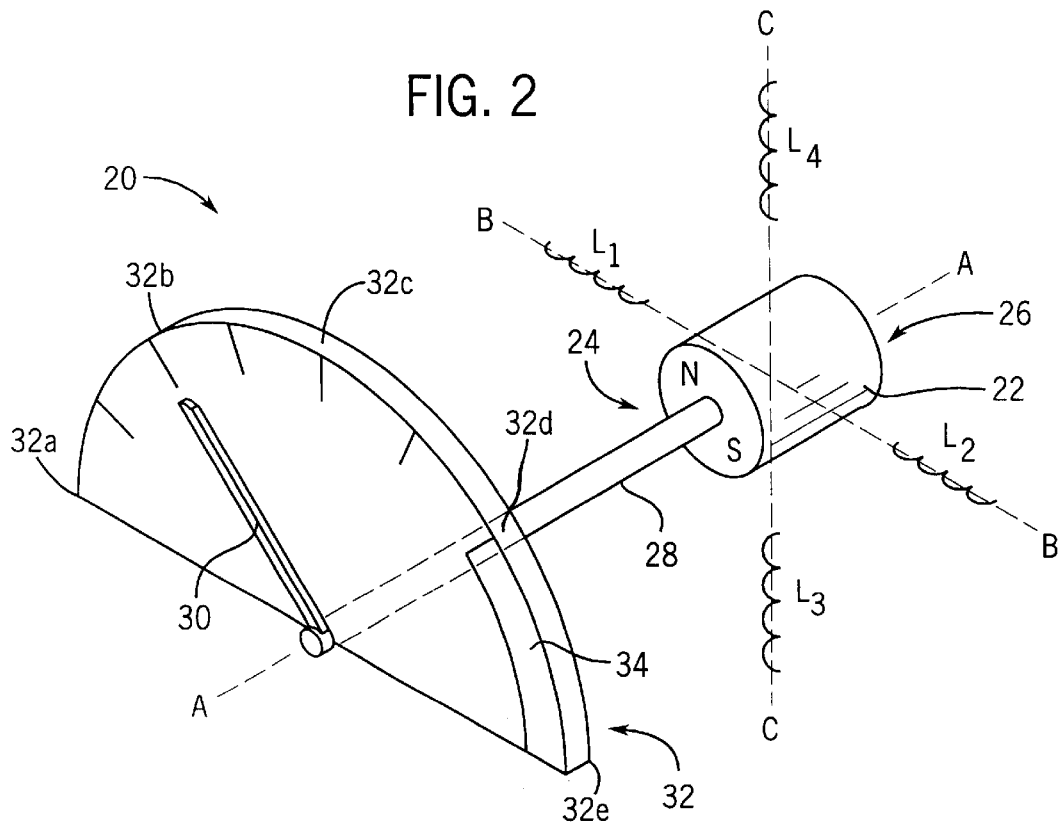
FIG. 2 is a perspective view of an analog gauge employing winding layouts in accordance with the circuitry of this invention.

Referring now to FIG. 2, an analog gauge 20 employing the circuitry and winding pattern of the present invention is illustrated. Although the present invention has been embodied as a temperature gauge for reference purposes, it should be understood that the apparatus and principles described herein can of course be applied to other non-linear instrument gauges as well.

Although various shapes and configurations of magnets are contemplated, gauge 20 includes, in a preferred embodiment, a generally cylindrical permanent magnet 22 having a longitudinal axis extending between a first end 24 of the magnet 22 and a second end 26 of the magnet 22. The north and south poles of the magnet 22 are separated transversely across the first end 24 and the second end 26. The magnet 22 is capable of rotation about an axis of rotation A—A that crosses a centroid of the magnet 22 running from the first end 24 of the magnet 22 to the second end 26.

Protruding from and fixedly attached to the first end 24 of the magnet 22 is the first end of a shaft 28 that is concentric with the axis of rotation A—A and has a generally smaller diameter than the magnet 22. Attached to the second end of the shaft 28 is a pointer arm 30 that lies in a plane that is generally orthogonal to the axis of rotation A—A. The pointer arm 30 is fixedly attached to the shaft 28 which is fixedly attached to the first end 24 of the magnet 22 such that the magnet 22 and shaft 28 and pointer arm 30 are capable of rotation about the axis of rotation A—A in tandem. In a preferred embodiment of the pointer arm 30, it comprises a needle.

Intermediate to the magnet 22 and pointer arm 30, and generally proximal to the latter, is a planar dial face 32 having generally equally spaced graduations thereon 32A–32E which generally extend radially outwards towards the perimeter of the dial face 32. The plane of the dial face 32 is substantially parallel to the plane of the pointer arm 30 and generally orthogonal to the axis of rotation A—A. The dial face 32 comprises graduations 32D and 32E at a terminal end thereof, defining what is referred to as the "red zone" 34 of operation. As the pointer arm 30 is moved over the dial face 32, it provides a visual representation of the angular displacement of the permanent magnet 22 and shaft 28 in accordance with the value of the measurand at the remote location, as will be elaborated upon below.

The permanent magnet 22 is driven by a coil assembly comprising coils $L_1$, $L_2$, $L_3$, and $L_4$. Coils $L_1$–$L_4$ are generally disposed about the permanent magnet 22 and wound on axes that are magnetically orthogonal to one another and lie in a plane that is orthogonal to the axis of rotation A—A. For example, coils $L_1$ and $L_2$ are wound about a first axis B—B which is orthogonal to a second axis C—C about which coils $L_3$ and $L_4$ are wound. The coils $L_1$–$L_4$ can be either wound or counterwound about their corresponding axis to achieve the magnetic vector layout described below.

The permanent magnet 22 responds to magnetic fields induced by electrical current passing through the coils $L_1$–$L_4$ in response to the value of a measurand such as the engine temperature of an automobile that is located remote from the permanent magnet 22. The relationship between the currents driven through the coils $L_1$–$L_4$ define the direction of angular displacement of the permanent magnet 22 whereby a coil that has more current flowing through it has a greater effect than the same coil having less current flow through it.

Via the coil assembly of the present invention, magnetic fields are induced in four directions emanating from a common origin point located at the intersection of first and second axes, B—B, C—C. The winding pattern of this invention yields better control over the permanent magnet because having electromagnetic fields extend in four directions about a common origin yields greater flexibility in setting the flat zone responsiveness of the circuit than does a winding pattern having electromagnetic fields extending in fewer directions.

Figure 3A:
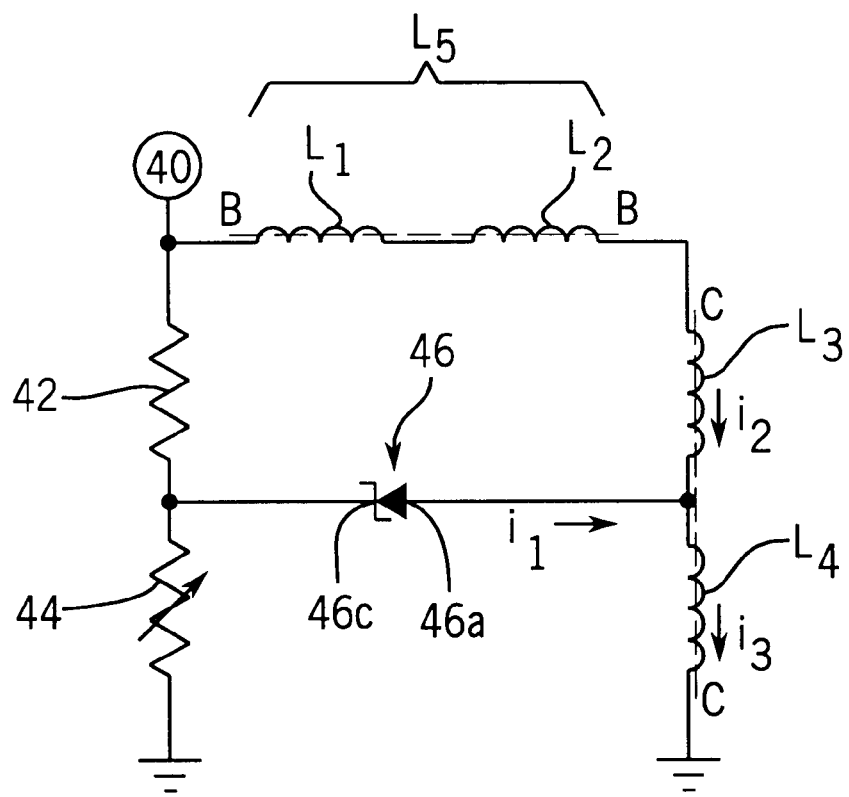
FIG. 3A is a schematic diagram of the flat response circuit of the present invention.

Referring now to FIG. 3A, the circuit of the present invention provides for a power source 40 such as a DC battery and a bridge resistor 42 having one terminal connected to the power source 40 and one terminal connected to a sender resistor such as a thermistor 44. The sender resistor 44 has one terminal connected to the bridge resistor 42 and one terminal connected to ground. In a preferred embodiment, this sender resistor 44 is a thermistor having an operating resistance of 125–15.2 $\Omega$. The actual resistance of the sender resistor 44 is inversely proportional to its temperature whereby when the temperature is relatively low, the resistance is relatively high; when the temperature is relatively high, the resistance is relatively low.

Further connected to the power source 40 is a first coil $L_1$ having one terminal connected to the power source 40 and one terminal connected to a second coil $L_2$. $L_2$ is in series with $L_1$ and has one terminal connected to $L_1$ and one terminal connected to a third coil $L_3$. $L_3$ is in series with $L_2$ and $L_1$ and has one terminal connected to $L_2$ and one terminal connected to a fourth coil $L_4$. $L_4$ has one terminal connected to $L_3$ and one terminal connected to ground. In addition, $L_1$ is wound about a first axis B—B, $L_2$ is counter-wound about the same first axis B—B, $L_3$ is wound about a second axis C—C which is magnetically orthogonal to the first axis, and $L_4$ is counter-wound about the same second axis C—C. $L_1$, $L_2$, and $L_3$ are formed from a single piece of uninterrupted wire having a resistance of approximately 144+/–6 $\Omega$, and $L_4$ is formed from a single piece of uninterrupted wire having a resistance of approximately 72+/–4$\Omega$. $L_1$ comprises approximately 180 turns of wire; $L_2$, approximately 465 turns; $L_3$, approximately 596 turns; and $L_4$, approximately 670 turns. In an alternative embodiment, a single coil $L_5$ comprises the first and second coils $L_1$, $L_2$.

The circuit further includes a zener diode 46 connected at its anode 46A to the common terminal between $L_3$ and $L_4$ and at its cathode 46C to the common terminal between the bridge resistor 42 and sender resistor 44. In a preferred embodiment, the zener diode 46 is a 3.3 V, 0.5 W zener diode, and, dependent on the resistance of the sender resistor 44, it allows current to flow both to and from relative to the common terminal between coils $L_3$ and $L_4$. The conductivity of the zener diode 46 depends on the resistance of the sender resistor 44 such as changes the relative voltages across the zener diode 46. Accordingly, the zener diode 46, in conjunction with the resistance of the sender resistor 44, establishes the flat zone responsiveness of the circuit of the present invention.

Figure 4A:
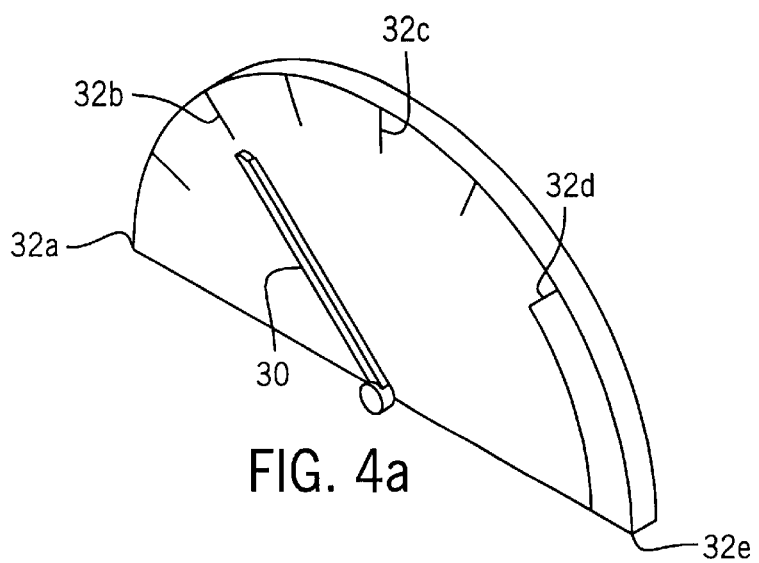
FIG. 4A is vector diagram, superimposed on a dial face, illustrating the resultant magnetic force acting on the permanent magnet and pointer arm of FIG. 2 when the zener diode is reversed biased.

At colder engine temperatures, the resistance of the sender resistor 44 is relatively high. The voltage at the cathode 46C of the zener diode 46 exceeds the voltage at the anode 46A by the zener voltage. Hence, the zener diode 46 is reverse biased to its zener voltage and current $i_1$ flows from the cathode 46C to the anode 46A. Thus, the zener diode 46 acts as a current path whereby the current $i_3$ flowing into coil $L_4$ exceeds the current flowing through the coils $L_1$, $L_2$ and $L_3$, namely $i_3 > i_2$ in accordance with Kirchhoff's law. Accordingly, the magnetic field $B_4$ induced by the current in coil $L_4$ is emphasized, and the resultant force created by summing the magnetic fields $B_1$–$B_4$ has an increased $B_4$ component. Thus, the permanent magnet 22 of FIG. 2 is drawn more into alignment by $B_4$, and the approximate magnitude and direction of the resultant force is as depicted in FIG. 4A, in which the pointer arm 30 tends to indicate colder engine temperatures according to the graduations 32a–32b of the dial face 32.

Figure 4B:
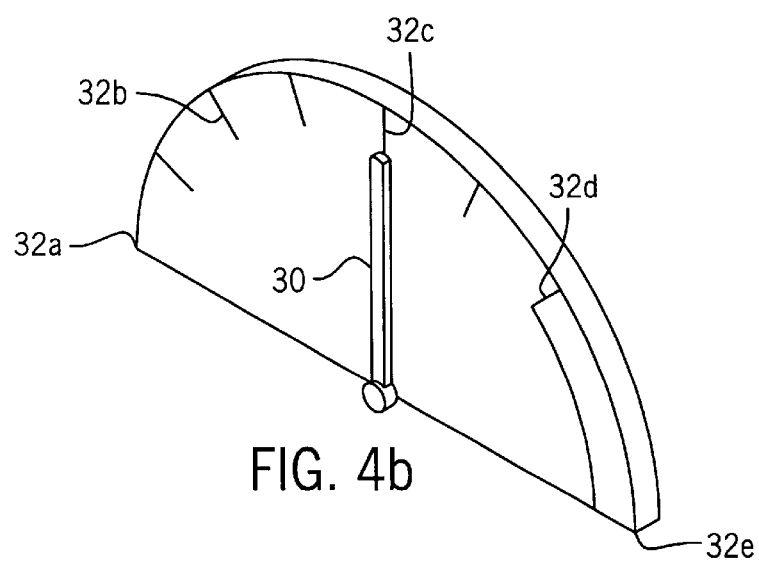
FIG. 4B is vector diagram, superimposed on a dial face, illustrating the resultant magnetic force acting on the permanent magnet and pointer arm of FIG. 2 when the zener diode is non-conductive.
Figure 4C:
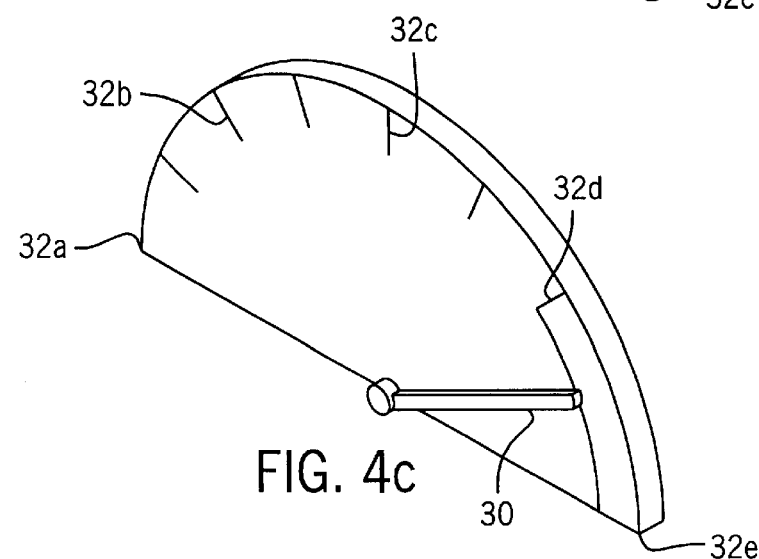
FIG. 4C is vector diagram, superimposed on a dial face, illustrating the resultant magnetic force acting on the permanent magnet and pointer arm of FIG. 2 when the zener diode is forward biased.

As the engine temperature begins to increase, the resistance of the sender resistor 44 begins to decrease and so does the voltage at the cathode 46C. A flat zone in the response of the gauge starts at a temperature when the voltage at the cathode 46C equals the voltage at the anode 46A plus the zener voltage. During the flat zone region, no current passes through the zener diode 46 (i.e., $i_1$=0 amps). The current $i_2$ and $i_3$ are the same so the permanent magnet 22, shaft 28 and pointer arm 30 do not respond to changes of the sender resistance value. As a result in FIG. 4b, the pointer arm 30 stays near 32C during the normal engine operation temperature range.

Figure 3B:
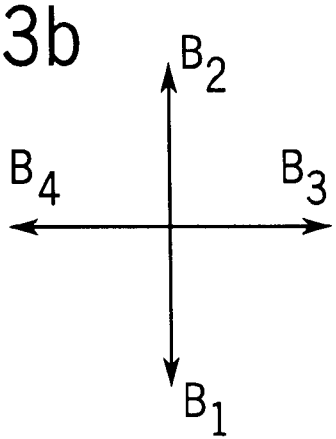
FIG. 3B is a vector diagram illustrating vectors corresponding to the magnetic fields induced by passing current through the coils of the circuit of FIG. 3A.

At high engine temperature, the resistance of the sender resistor 4C decreases to a point that voltage at anode 46A is higher then voltage at cathode 46C plus the zener forward voltage drop. Starting at this higher temperature, current flows from the anode 46A to cathode 46C. The current i2 is thus larger than the current i3 in FIG. 3a. Consequently, magnetic field created by L3 is relatively higher to the one created by L4. The increasing magnetic field at L3 pulls the magnet 22 in the clockwise direction if L2>L1 (i.e. B2>B1) in FIG. 2. Alternatively, the pointer is pulled in the counter clockwise direction if L2<L1 (i.e. B2<B1) in FIG. 3. The pointer is very sensitive to the temperature change in this high temperature region.

The spirit of the present invention is not limited to any embodiment described above. Rather, the details and features of an exemplary embodiment were disclosed as required. Without departing from the scope of this invention, other modifications will therefore be apparent to those skilled in the art. Thus, it must be understood that the detailed description of the invention and drawings were intended as illustrative only, and not by way of limitation.

To apprise the public of the scope of this invention, the following claims are made:

I claim:

1. An automotive gauge comprising:
   at least two first stator coils wound about a first axis to induce magnetic fields in two opposite directions along the first axis;
   at least two second stator coils wound about a second axis to induce magnetic fields in two opposite directions along the second axis, the second axis being magnetically orthogonal to the first axis;

a sender element connected between first and second nodes, and a threshold-conducting element connected between a junction between the second stator coils and the first node;

whereby the stator coils are serially connected to form a conductive path through each coil from a power source to ground, and whereby the sender element causes a change of current flow through the conducting element changing the relative current flow through the two-second stator coils.

2. The automotive gauge of claim 1 wherein the sender element is a thermistor.

3. The automotive gauge of claim 2 wherein the sender element is connected by way of the first node to a bridge resistor, wherein the bridge resistor has a fixed resistance and is connected between the power source and the first node, and wherein a resistance of the sender element is inversely proportionally to its temperature.

4. The automotive gauge of claim 3 wherein the thermistor has an operating resistance of 125–15.2 Ω.

5. The automotive gauge of claim 4 wherein the threshold conducting element is a zener diode having its cathode connected to the first node and its anode connected to the junction between the second stator coils.

6. An automotive gauge for use with a variable sender resistance comprising:

a permanent magnet which rotates about an axis of rotation extending through a centroid of the magnet;

a shaft oriented along the axis of rotation and fixedly attached to the magnet so as to be capable of rotation with the magnet, a first, second, third, and fourth coil disposed about the magnet, the first and second coils being substantially coaxial about a first axis, the third and fourth coils being substantially co-axial about a second axis which is magnetically orthogonal to the first axis, the first, second, third, and fourth coils connected sequentially between a power terminal and a ground terminal with the first coil connected to the power terminal and the fourth coil connected to the ground terminal;

a bridge resistor connected between the power terminal and a sender terminal; and a zener diode connected at its anode to a junction of the third and fourth coils and at its cathode to the sender terminal.

7. The automotive gauge of claim 6 wherein the first and second and third coils are in series.

8. The automotive gauge of claim 7 wherein the first and second and third and fourth coils are formed from a single piece of uninterrupted wire.

9. The automotive gauge of claim 8 wherein the first and second coils are counterwound.

10. The automotive gauge of claim 9 wherein the third and fourth coils are counterwound.

11. The automotive gauge of claim 10 wherein the fourth coil comprises more turns of wire than the third coil.

12. The automotive gauge of claim 11 wherein the third coil comprises more turns of wire than the second coil.

13. The automotive gauge of claim 12 wherein the second coil comprises more turns of wire than the first coil.

14. The automotive gauge of claim 13 wherein a single coil comprises the first and second coils.

15. The automotive gauge of claim 13 wherein the first, second, third and fourth coils are formed from a common gauge of wire.

16. The automotive gauge of claim 3, wherein the second node is connected to ground.

17. The automotive gauge of claim 6, wherein the sender terminal is a first terminal of a sender element having both the first terminal and a second terminal.

18. The automotive gauge of claim 17, wherein the second terminal of the sender element is coupled to ground.

19. The automotive gauge of claim 18, wherein the sender element is a thermistor.

* * * * *

UNITED STATES PATENT AND TRADEMARK OFFICE
CERTIFICATE OF CORRECTION

PATENT NO. : 6,362,616 B1  
DATED : March 26, 2002  
INVENTOR(S) : Lo

It is certified that error appears in the above-identified patent and that said Letters Patent is hereby corrected as shown below:

Column 6,  
Line 39, "i2" should be -- $i_2$ --.  
Line 40, "i3" should be -- $i_3$ --.  
Line 41, "L3" should be -- $L_3$ --.  
Line 42, "L4" should be -- $L_4$ --.  
Line 42, "L3" should be -- $L_3$ --.  
Line 43, "L2>L1" should be -- $L_2>L_1$ --.  
Line 43, "B2>B1" should be -- $B_2>B_1$ --.  
Line 45, "L2<L1" should be -- $L_2<L_1$ --.  
Line 45, "B2<B1" should be -- $B_2<B_1$ --.

Signed and Sealed this

Twenty-third Day of July, 2002

Attest:

Attesting Officer

JAMES E. ROGAN  
*Director of the United States Patent and Trademark Office*